(12) United States Patent
Saito et al.

(10) Patent No.: US 6,252,776 B1
(45) Date of Patent: Jun. 26, 2001

(54) HEAT RADIATING MEMBER FOR HEAT GENERATING DEVICE

(75) Inventors: Yoshiyuki Saito; Takaya Suzuki, both of Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/358,771

(22) Filed: Jul. 22, 1999

(30) Foreign Application Priority Data

Jul. 23, 1998 (JP) .................................................. 10-208000

(51) Int. Cl.⁷ ........................................................ H05K 7/20
(52) U.S. Cl. .......................... 361/719; 361/704; 361/707; 361/708; 174/52.4
(58) Field of Search ........................................ 361/702, 704, 361/705, 706, 713, 717–719, 722; 165/80.3, 185; 174/16.3, 252; 257/706, 707, 712, 713, 722, 730, 731

(56) References Cited

U.S. PATENT DOCUMENTS

| | | | |
|---|---|---|---|
| T105,403 | * 5/1985 | Hultmark | 257/697 |
| 4,879,629 | * 11/1989 | Tustaniwskyj et al. | 361/699 |
| 5,268,814 | * 12/1993 | Yakubowski | 361/704 |
| 5,311,402 | * 5/1994 | Kobayashi et al. | 361/707 |
| 5,699,229 | * 12/1997 | Brownell | 361/719 |
| 5,730,210 | * 3/1998 | Kou | 361/704 |
| 5,757,621 | * 5/1998 | Patel | 361/719 |
| 5,881,800 | * 3/1999 | Chung | 165/80.3 |
| 5,883,783 | * 3/1999 | Torturro | 361/704 |
| 5,901,039 | * 5/1999 | Dehaine et al. | 361/704 |
| 5,907,474 | * 5/1999 | Dolbear | 361/705 |
| 6,023,413 | * 2/2000 | Umezawa | 361/697 |

FOREIGN PATENT DOCUMENTS 8-139235   5/1996   (JP) .

* cited by examiner

Primary Examiner—Leo P. Picard
Assistant Examiner—Boris L. Chervinsky
(74) Attorney, Agent, or Firm—Ostrolenk, Faber, Gerb & Soffen, LLP

(57) ABSTRACT

An IC is mounted on a printed board. A radiator made of copper is arranged on the printed board so as to surround the IC and is fastened onto the printed board by screws provided on the back surface of the board. The central portion of a ceiling on the inner surface of the radiator protrudes downward and the lower surface of the protrusion becomes a contact surface contacting with the IC. Heat-conducting rubber is also provided on the lower portions of the radiator, i.e., portions at which the radiator contacts with the printed board. With this arrangement, a heat radiating member for the heat generating device having high radiation effect can be obtained.

4 Claims, 1 Drawing Sheet

HEAT RADIATING MEMBER FOR HEAT GENERATING DEVICE

BACKGROUND OF THE INVENTION

1. Field of the Invention

The present invention relates to a heat radiating member for a heat generating device, capable of improving the heat radiating characteristics of the heat generating device, such as an integrated circuit in an electronic equipment, which generates heat while being used.

2. Description of the Related Art

FIG. 1 shows a conventional heat radiating member of this type for a heat generating device. An integrated circuit (IC) 3 is mounted on a printed board 2 and a radiator 1 is fastened onto the printed board 2 by screws 4 to surround the IC 3. Heat-conducting rubber 5 is interposed between the inner surface of the radiator 1 and the upper surface of the IC 3 and the IC 3 comes in contact with the radiator 1 through this heat-conducting rubber 5.

The heat-conducting rubber 5 has high heat conductivity and high stretching characteristics. Due to this, the heat-conducting rubber 5 absorbs the irregularity of the thickness of the IC 3 and that of the height of the radiator 1, conducts good heat transfer while ensuring the contact between the IC 3 and the heat-conducting rubber 5 and that between the heat-conducting rubber 5 and the radiator 1, and then cools the IC 3.

In the above-stated conventional heat transfer member for the heat generating device, while the heat-conducting rubber 5 has excellent heat transfer efficiency, it has disadvantageously low heat conductivity. That is, the heat conductivity of the heat-conducting rubber 5 is as low as about 5 W/m° C., which is extremely low compared with that of metal, such as copper, i.e., 380 W/m° C. Due to this disadvantage, the conventional heat transfer member produces an insufficient heat radiating effect.

SUMMARY OF THE INVENTION

It is, therefore, an object of the present invention to provide a heat radiating member for a heat generating device having a high heat radiating effect.

A heat radiating member for a heat generating device according to the present invention is characterized by comprising a radiator provided on a board to surround a heat generating device mounted on the board, the radiator directly contacting with the heat generating device; and a heat-conducting elastic member interposed between the radiator and the board.

The heat radiating member for the heat generating device may be constituted such that part of an inner surface of the radiator protrudes to thereby form a protrusion at which the radiator contacting with the heat generating device. The board may be a printed wiring board and the heat generating device may be an integrated circuit device mounted on the printed wiring board. The heat radiating member is formed of, for example, copper.

According to the present invention, the radiator directly contacts with the heat generating device, so that the heat generated at the heat generating device is transferred to the radiator with high efficiency and the heat is radiated at the radiator with high efficiency. Moreover, a heat-conducting elastic member is provided between the radiator and the substrate, so that the irregularities of the heights of the heat generating device and of the radiator are absorbed by this elastic member.

DESCRIPTION OF THE PREFERRED EMBODIMENT

Figure 1:
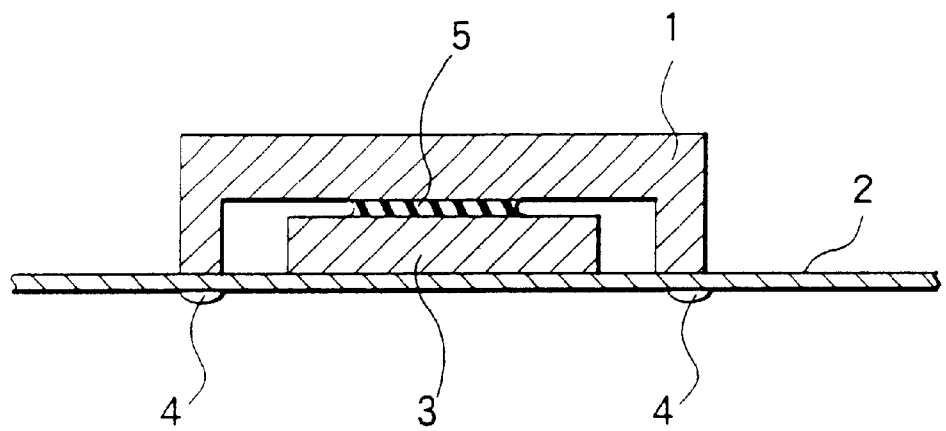
FIG. 1 is a cross-sectional view showing a conventional heat radiating member of a heat generating device.
Figure 2:
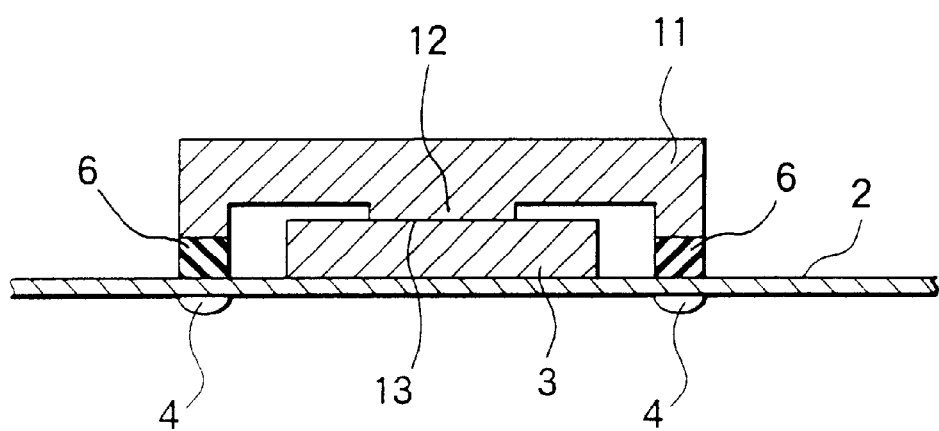
FIG. 2 is a cross-sectional view showing a heat radiating member of a heat generating device in one embodiment according to the present invention.

Now, the preferred embodiment of the present invention will be specifically described with reference to the accompanied drawings. FIG. 2 shows a heat radiating member for a heat generating device in one embodiment according to the present invention. As shown therein, an IC 3 is mounted on a printed board 2. A radiator 11 is provided on the printed board 2 so as to surround the IC 3. The radiator 11 is fastened onto the printed board 2 by screws 4 on the back surface of the board 2. The radiator 11 is made of, for example, metal such as copper or a metal alloy.

In this embodiment, the central portion of a ceiling on the inner surface of the radiator 11 protrudes downward. The upper surface of the protrusion 12 becomes a contact surface 13 contacting with the IC 3. Also, a heat-conducting rubber 6 is provided at the lower portions of the radiator 11, i.e., portions of the radiator 11 contacting with the printed board 2.

In the heat radiating member for a heat generating device as constituted above in this embodiment, the radiator 11 is arranged such that the inner protrusion 12 directly contacts with the IC 3. Due to this, the height of the radiator 11 becomes irregular by, for example, the height of the IC 3 and that of the protrusion 12 of the radiator 11. Nevertheless, since the radiator 11 is attached onto the printed board 2 through the heat-conducting rubber 6, the vertical irregularities of the IC 3 and the radiator 11 are absorbed by the stretching characteristics of the heat-conducting rubber 6.

In this embodiment, since the IC 3 directly contacts with the radiator 11 on the contact surface 13, heat generated at the IC 3 is transferred to the radiator 11 with high heat conductivity. As a result, the heat generated at the IC 3 is radiated by the radiator 11 with high efficiency, thereby providing a high cooling effect.

It is noted that heat-conducting grease may be injected between the contact surface 13 and the IC 3, depending on the surface roughness of the contact surface 13.

As stated so far, according to the present invention, the radiator is brought into direct contact with the heat generating device such as an IC without using heat-conducting rubber and the heat of the heat generating device is transferred to the radiator with high efficiency. It is, thus, possible to cool the heat generating device with extremely high efficiency.

What is claimed is:

1. A heat radiating member for a heat generating device comprising:

a radiator provided on a board to surround a heat generating device mounted on said board, said radiator directly contacting with said heat generating device; and a heat-conducting elastic member interposed between the radiator and said board.

2. The heat radiating member for the heat generating device according to claim 1, wherein part of an inner surface of said radiator protrudes to thereby form a protrusion, said radiator contacting with said heat generating device at the protrusion.

3. The heat radiating member for the heat generating device according to claim 1, wherein said board is a printed wiring board and said heat generating device is an integrated circuit device mounted on said printed wiring board.

4. The heat radiating member for the heat generating device according to claim 1, wherein said heat radiating member is formed of copper.

* * * * *